United States Patent
Chang

[19]

[11] Patent Number: 5,970,357
[45] Date of Patent: Oct. 19, 1999

[54] METHOD AND STRUCTURE FOR MANUFACTURING HIGH-RESISTANCE POLYSILICON LOADS IN A SEMICONDUCTOR PROCESS

[75] Inventor: Ming-Lun Chang, Hsinchu, Taiwan

[73] Assignee: Winbond Electronics Corporation, Hsinchu, Taiwan

[21] Appl. No.: 09/081,299

[22] Filed: May 20, 1998

[30] Foreign Application Priority Data

May 2, 1998 [TW] Taiwan .................................. 87106800

[51] Int. Cl.⁶ ...................................... H01L 27/02
[52] U.S. Cl. ...................... 438/382; 438/384; 257/536; 257/538
[58] Field of Search ...................... 438/330, 238, 438/210, 381, 382, 383, 384; 257/536, 538, 581, 380, 571; 29/610.1; 338/228 D

[56] References Cited

U.S. PATENT DOCUMENTS

| | | | |
|---|---|---|---|
| 5,352,923 | 10/1994 | Boyd et al. | 257/536 |
| 5,602,408 | 2/1997 | Watanabe et al. | 257/536 |
| 5,757,053 | 5/1998 | Lui | 257/538 |
| 5,861,331 | 1/1999 | Chien | 438/238 |
| 5,885,862 | 3/1999 | Jao et al. | 438/384 |

*Primary Examiner*—Donald Monin
*Assistant Examiner*—Michael Dietrich
*Attorney, Agent, or Firm*—Birch, Stewart, Kolasch & Birch, LLP.

[57] ABSTRACT

High-resistance polysilicon layers applied in 4T SRAM memory cells serving as loads, are manufactured by a simple method according to the invention. In the small-scale 4T SRAM memory cell process, it is not possible to fabricate traditional polysilicon loads manufactured by the prior art with a desired high degree of resistance. As a result, the miniaturization of 4T SRAM memory cells has been limited. However, in the method according to the invention, the lengths of polysilicon loads are greatly increased without increasing the sizes of corresponding memory cells, thereby efficiently increasing the resistance of the polysilicon loads. Therefore, this method according to invention can completely eliminate any limitation to the small-scale 4T SRAM memory cell process caused by the manufacture of the polysilicon loads as described above.

8 Claims, 7 Drawing Sheets

METHOD AND STRUCTURE FOR MANUFACTURING HIGH-RESISTANCE POLYSILICON LOADS IN A SEMICONDUCTOR PROCESS

BACKGROUND OF THE INVENTION

1. Field of the Invention

The invention relates to a semiconductor process, and in particular to a method and a structure for manufacturing high-resistance polysilicon loads in the semiconductor process.

2. Description of the Related Art

As is well known, high-resistance polysilicon layers are commonly used as loads in 4T SRAM memory cells. Traditionally, to manufacture polysilicon loads, a polysilicon layer is first deposited. Then, a high-energy ion implantation is performed to adjust the resistance thereof. After that, the polysilicon layer is patterned to form a plurality of polysilicon loads by photolithography and etching techniques. Next, parts of the polysilicon loads are ion implanted with a high-concentration dopant, thereby forming the required connectors. Referring to FIG. 1, a structure of polysilicon loads manufactured by the prior art is shown. In FIG. 1, reference numerals 10, 11, 12, 19' and 20 represent a substrate, polysilicon layers, a TEOS layer, polysilicon loads and connectors, respectively. The FIG. 2 is a top view of FIG. 1. In other words, the FIG. 1 is a cross-sectional view of FIG. 2 along line I—I. Clearly, the resistance of the polysilicon loads depends on the amount of the first implanted dopant, the thicknesses, widths and lengths of the polysilicon loads etc. In order to obtain sufficient high-resistance loads, a traditional method is used to reduce the thicknesses, increase the lengths or decrease the widths of polysilicon loads. However, with miniaturization of memory cells, this traditional method can no longer produce polysilicon loads of sufficient high-resistance. The reason is that out-diffusion caused by dopant inside the connectors greatly shortens the effective lengths of such polysilicon loads. In the past, increasing the lengths of polysilicon loads has been limited by the miniaturization of memory cells. Reducing the widths of polysilicon loads has been limited by processing capabilities. Therefore, the drawbacks of the traditional method of manufacturing polysilicon loads has been one of the factors to affect the miniaturization of memories.

SUMMARY OF THE INVENTION

In view of the above, the objective of the invention is to provide a method which greatly increases the lengths of polysilicon loads without increasing the sizes of memory cells, thereby resolving the above-mentioned problem. The method for manufacturing high-resistance polysilicon loads in the semiconductor process according to the invention, suitable for a substrate in which a plurality of conductive layers are already formed, comprises the following steps: First, a first dielectric layer is formed on the substrate and the conductive layers. A trench is formed in the first dielectric layer. Consequently, a second dielectric layer protruding over the surface of the first dielectric layer, is formed in the trench. Spacers are formed on both sides of the second dielectric layer over the surface of the first dielectric layer. Thereafter, the second dielectric layer is removed. A plurality of contact windows are formed in the first dielectric layer just on the conductive layer. Then, a polysilicon layer is formed on the first dielectric layer, the contact windows, the spacers and the trench. A first ion implantation is performed on the polysilicon layer. Finally, the polysilicon layer is patterned to form a plurality of polysilicon loads perpendicular to the trench and the spacers, then a second ion implantation is performed on parts of the polysilicon loads just on the contact windows and another intended parts of the polysilicon loads.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE EMBODIMENT

Referring to FIGS. 3A~3H, a method for manufacturing high-resistance polysilicon loads according to the invention is shown. This method, suitable for a substrate 10 in which a plurality of conductive layers (just one of them shown) 11, such as first polysilicon layers, are already formed, comprises the following steps:

Step 1

Figure 1:
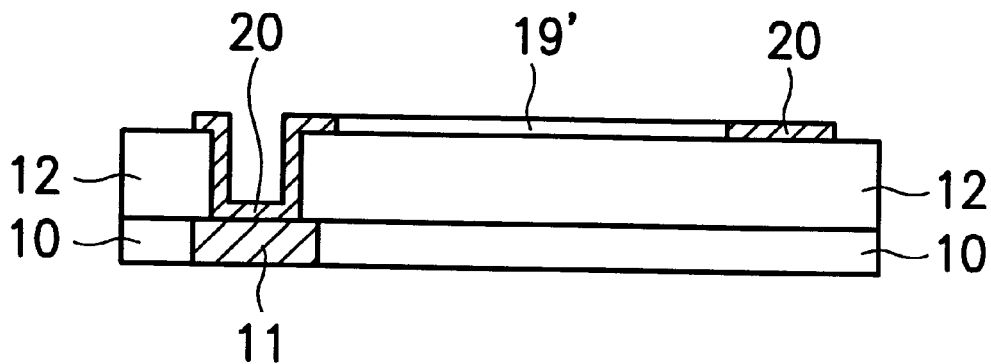
FIG. 1 is a cross-sectional view showing a structure of a polysilicon load manufactured by the prior art.
Figure 2:
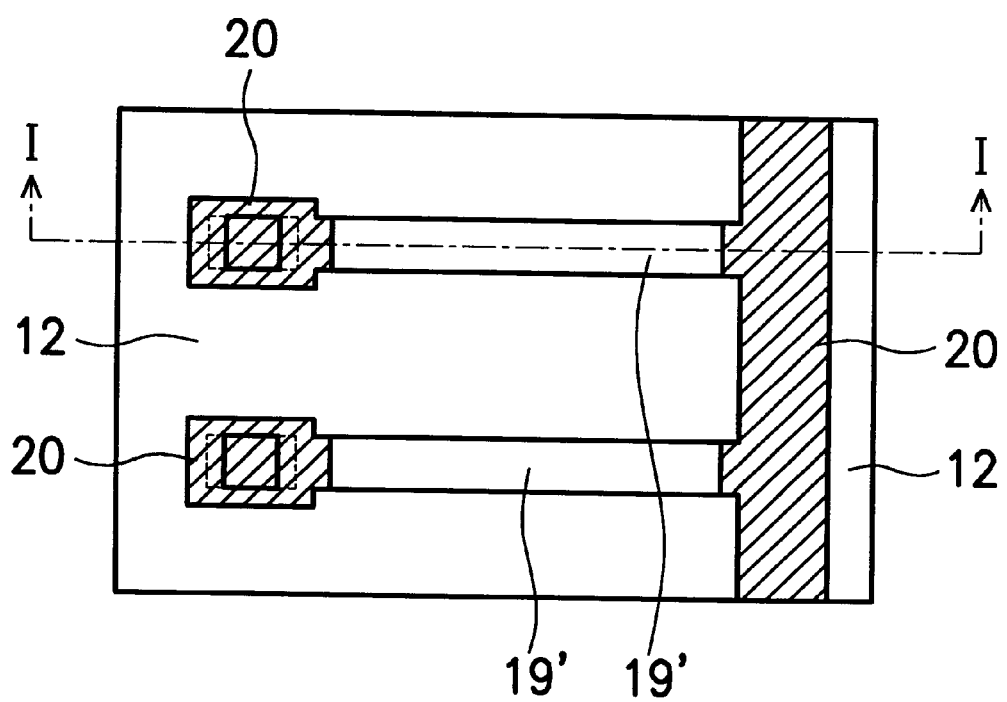
FIG. 2 is a top view of FIG. 2.
Figure 3A:
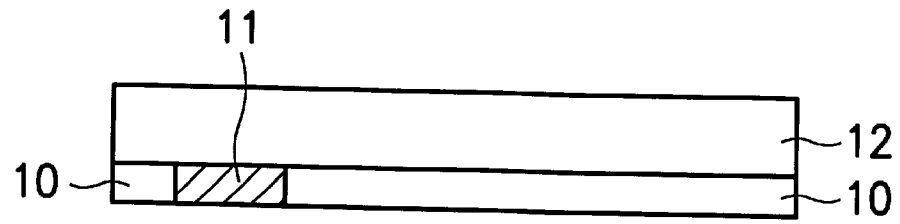
FIGS. 3A~3H are cross-sectional views showing a method for manufacturing high-resistance polysilicon loads according to the invention.

As shown in FIG. 3A, a first dielectric layer 12, such as an undoped TEOS layer, is formed on the substrate 10 and the first polysilicon layers 11 by using chemical vapor deposition.

Step 2

Figure 3B:
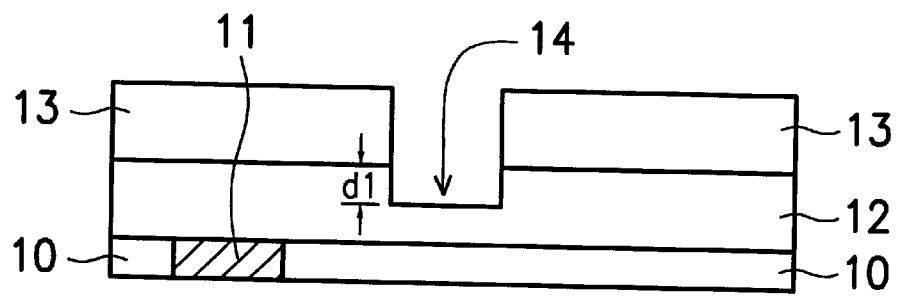

As shown in FIG. 3B, a first photoresist 13 is formed on the undoped TEOS layer 12 by photolithography. Then a trench 14 with a depth of d1 is formed in the undoped TEOS layer 12 by plasma etching.

Step 3

Figure 3C:
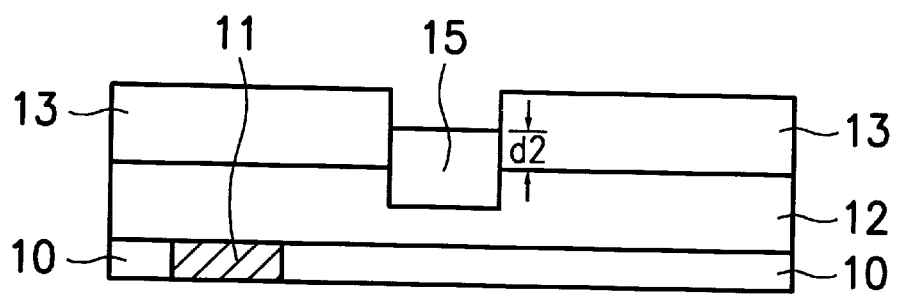

As shown in FIG. 3C, a second dielectric layer 15, such as a doped oxide layer, the height of which protrudes over the surface of the undoped TEOS layer 12 by a height of d2, is formed in the trench 14 by liquid phase deposition (LPD).

Step 4

Figure 3D:
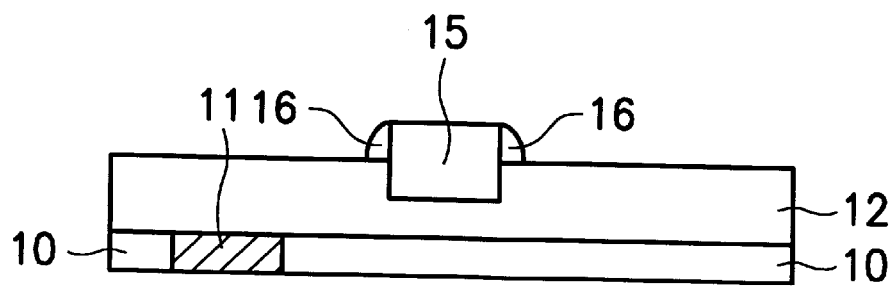

As shown in FIG. 3D, the first photoresist 13 is first removed by wet etching. After that, a dielectric layer (not shown), such as an undoped TEOS layer, is formed on the undoped TEOS layer 12 and the doped oxide layer 15. Then, this dielectric layer is etched back by an isotropic etching, thereby forming spacers 16, such as undoped TEOS spacers, on both sides of the doped TEOS layer 15 over the surface of the undoped TEOS layer 12.

Step 5

Figure 3E:
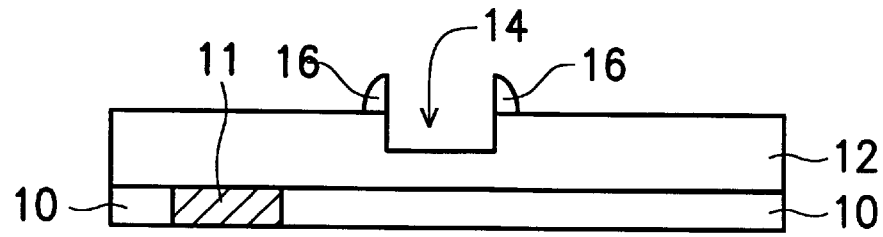

As shown in FIG. 3E, the doped TEOS layer 15 is removed by a selective etching with a vapor of HF.

Step 6

Figure 3F:
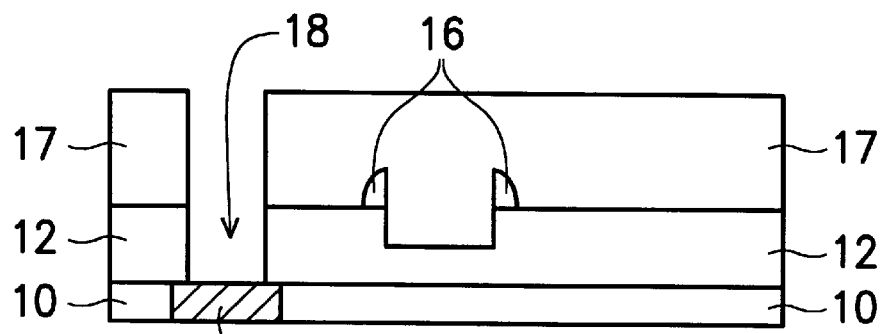

As shown in FIG. 3F, a second photoresist 17 is first formed on the undoped TEOS layer 12, the undoped TEOS spacers 16 and the trench 14 by photolithography. Consequently, contact windows 18 are formed in the undoped TEOS layer 12 just on the first polysilicon layers by plasma etching.

Step 7

Figure 3G:
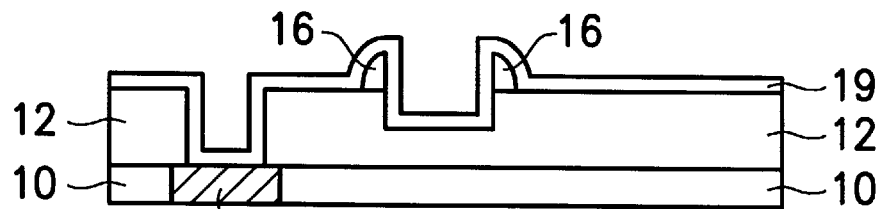

As shown in FIG. 3G, the second photoresist 17 is previously removed by wet etching. Then, a second polysilicon layer 19 is formed on the undoped TEOS layer 12, the contact windows 18, the spacers 16 and the trench 14 by chemical vapor deposition. Thereafter, a first ion implantation is performed on the second polysilicon layer 19, thereby adjusting the resistance thereof.

Step 8

Figure 3H:
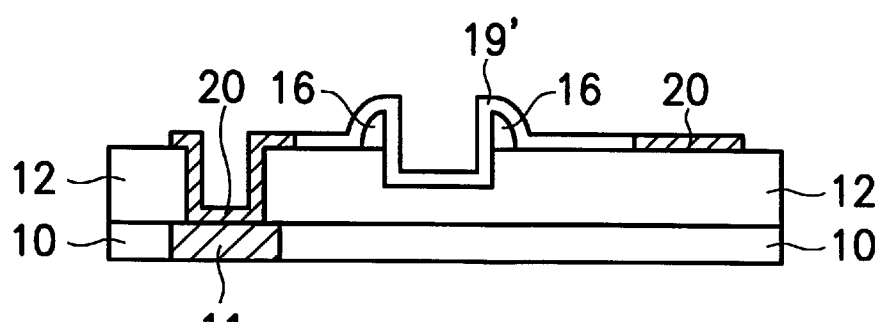
Figure 4A:
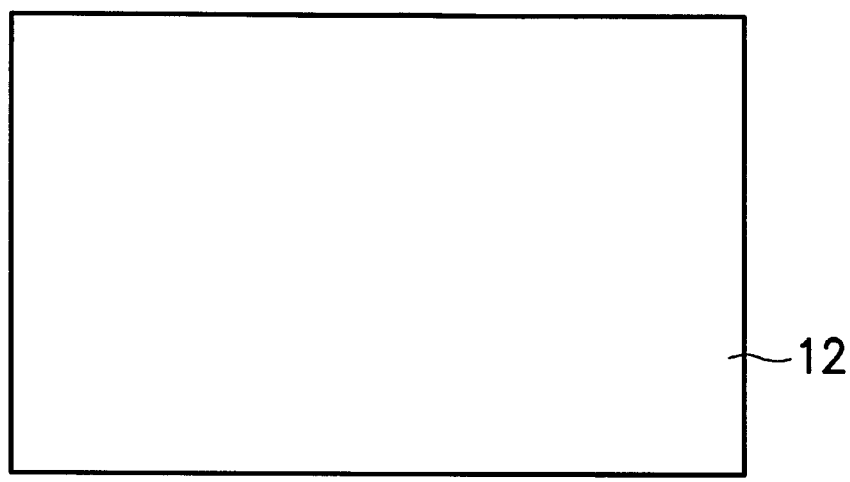
FIGS. 4A~4H are top views of FIGS. 3A~3H, respectively.
Figure 4B:
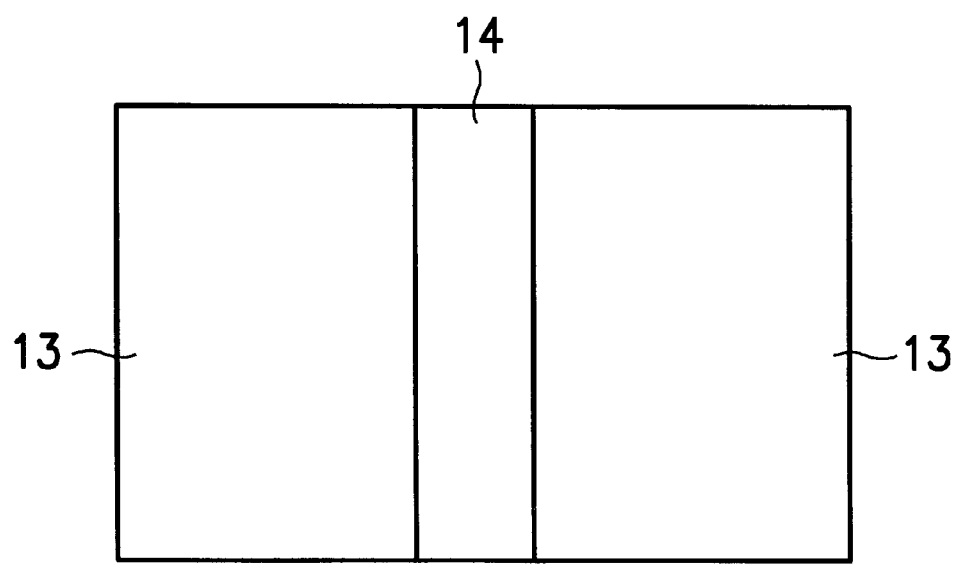
Figure 4C:
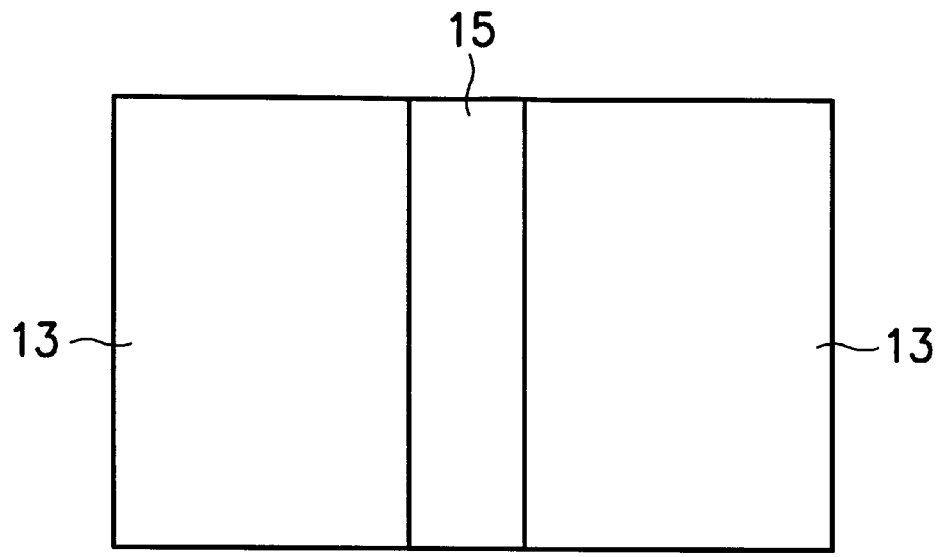
Figure 4D:
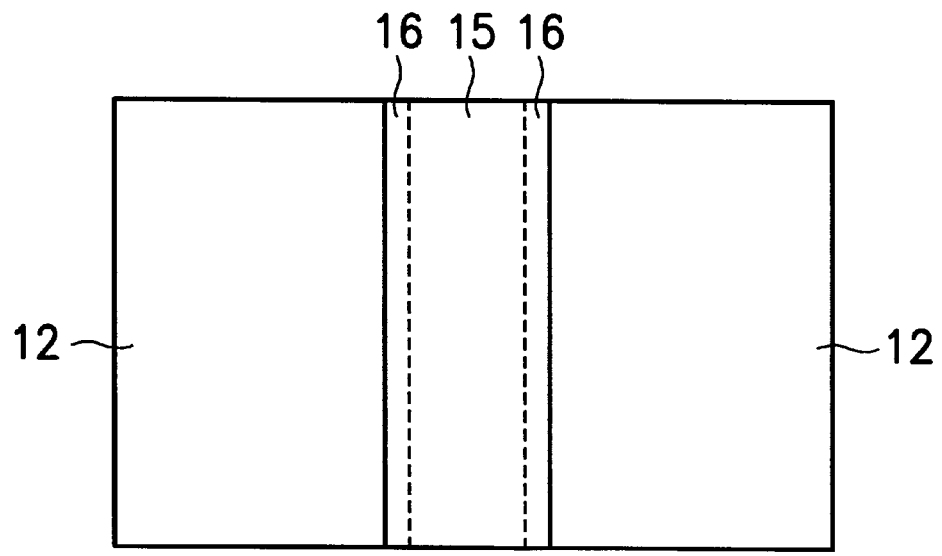
Figure 4E:
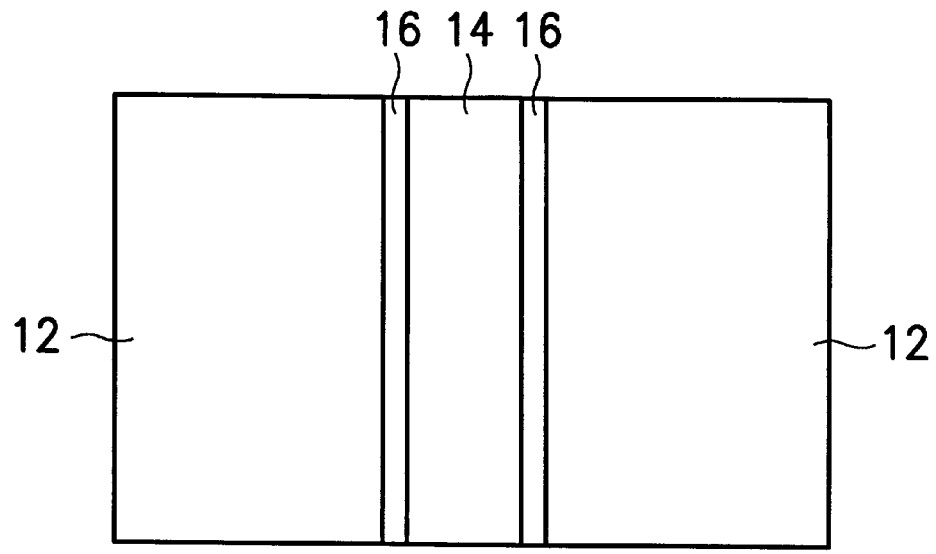
Figure 4F:
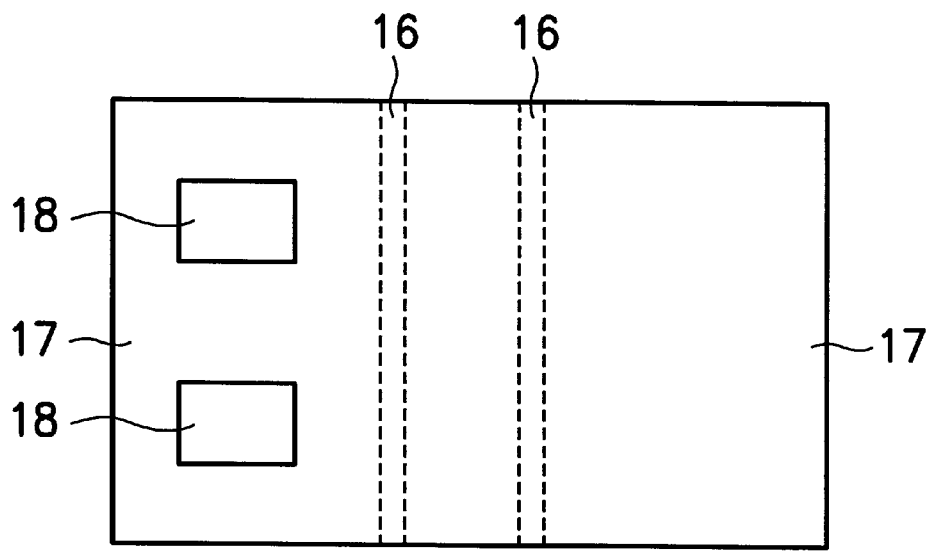
Figure 4G:
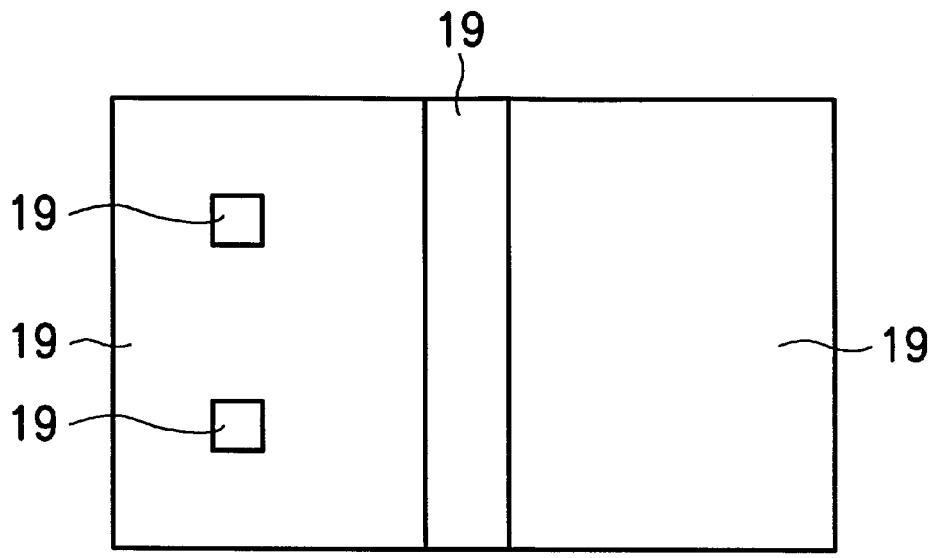
Figure 4H:
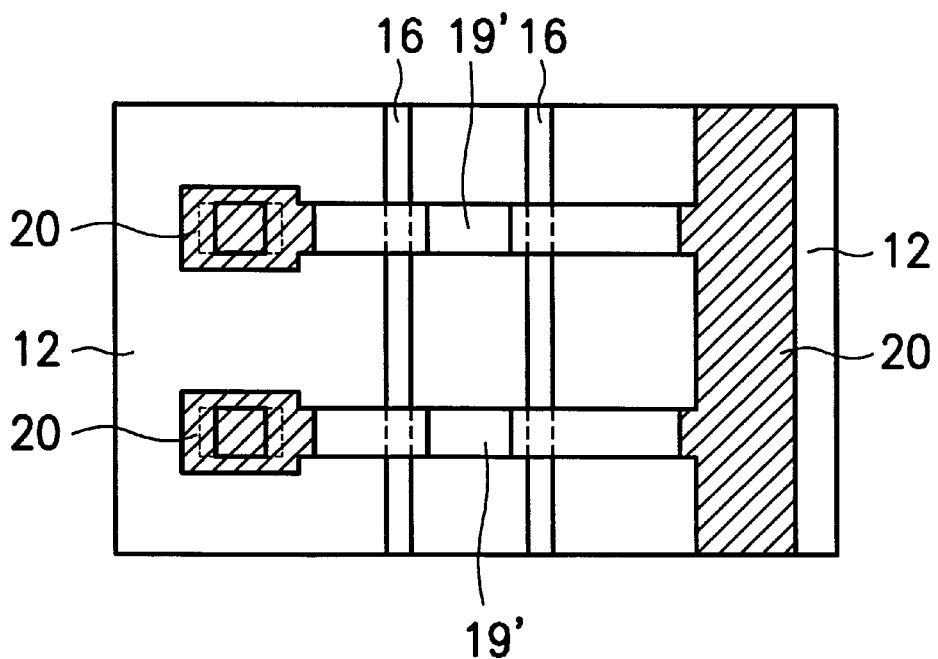

As shown in FIG. 3H, the second polysilicon layer 19 is patterned to form a plurality of polysilicon loads 19' perpendicular to the trench 14 and the spacers 16 (just one of them shown), then a second ion implantation is performed on parts of the polysilicon loads 19' just over the contact windows 18 and other intended parts of the polysilicon loads to form connectors 20.

Furthermore, FIGS. 4A~4H are top views corresponding to FIG. 3A~3H with the same reference numerals.

In addition, the characteristics of the invention will be described hereinafter.

(a) The trench 14 formed in the undoped TEOS layer 12 is perpendicular to the polysilicon loads 19'. Basically, the depth d1 of the trench 14 less than the thickness of the updoped TEOS layer 12 is taken as a rule.

(b) The doped oxide layer 15 is formed only in the trench 14 by liquid phase deposition before removing the first photolithography 13. Part of the doped oxide layer 15 protruding over the surface of the undoped TEOS layer 12 has a height of d2.

(c) The undoped TEOS spacers 16 are formed on both sides of the doped oxide layer 15 by etching back the undoped TEOS layer (not shown). After that, the doped oxide layer 15 is removed by selective etching, exposing the trench 14 again. However, the spacers 16 still remain on the surface of the undoped TEOS layer 12, (d) Since the trench 14 and spacer 16 are perpendicular to the polysilicon loads 19', the effective lengths of the polysilicon loads are increased. The increased length of each polysilicon load 19' is twice the d1 value plus 4 times the d2 value. For example, if the d1 value is 1,000Å and the d2 value is 1,000Å, the length of each polysilicon load is increased about 0.6 $\mu$m; if the d1 value is 2,500Å and the d2 value is 1,000Å, the length of each polysilicon load is increased about 1.2 $\mu$m. Therefore, the effective length of each polysilicon load can be easily adjusted by controlling the d1 and d2 values so as to meet the requirements of memory cells. In other words, since the lengths of polysilicon loads are increased, the influence of out-diffusion is reduced, and limitation to the miniaturization of memories is mostly eliminated when manufacturing high-resistance polysilicon loads.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for manufacturing high-resistance polysilicon loads in a semiconductor process, suitable for a substrate in which a plurality of conductive layers are already formed, comprising:

forming a first dielectric layer on said substrate and said conductive layers;

forming a trench in said first dielectric layer and said substrate;

forming a second dielectric layer protruding over the surface of said first dielectric layer, in said trench;

forming spacers on both sides of said second dielectric layer over the surface of said first dielectric layer;

removing said second dielectric layer;

forming a plurality of contact windows in said first dielectric layer and said substrate just over said conductive layers;

forming a polysilicon layer on said first dielectric layer, said contact windows, said spacers and said trench; and patterning said polysilicon layer to form polysilicon loads on sidewalls of said trench and said spacers.

2. A method for manufacturing high-resistance polysilicon loads in a semiconductor process as claimed in claim 1, further comprising performing a first ion implantation on said polysilicon layer before patterning said polysilicon layer.

3. A method for manufacturing high-resistance polysilicon loads in a semiconductor process as claimed in claim 1, further comprising performing a second ion implantation on parts of said polysilicon loads just over said contact windows and other intended parts of said polysilicon loads after patterning said polysilicon layer.

4. A method for manufacturing high-resistance polysilicon loads in a semiconductor process as claimed in claim 1, wherein said conductive layers are polysilicon layers.

5. A method for manufacturing high-resistance polysilicon loads in a semiconductor process as claimed in claim 1, wherein said first dielectric layer is an undoped TEOS layer.

6. A method for manufacturing high-resistance polysilicon loads in a semiconductor process as claimed in claim 1, wherein said second dielectric layer is a doped oxide layer.

7. A method for manufacturing high-resistance polysilicon loads in a semiconductor process as claimed in claim 6, wherein said doped oxide layer is removed by selective etching with a vapor of HF.

8. A method for manufacturing high-resistance polysilicon loads in a semiconductor process as claimed in claim 1, wherein said spacers are undoped TEOS layers.

* * * * *